US010007191B2

(12) United States Patent
Biafore et al.

(10) Patent No.: US 10,007,191 B2
(45) Date of Patent: Jun. 26, 2018

(54) METHOD FOR COMPUTER MODELING AND SIMULATION OF NEGATIVE-TONE-DEVELOPABLE PHOTORESISTS

(71) Applicant: KLA-Tencor Corporation, Milpitas, CA (US)

(72) Inventors: John J. Biafore, N. Scituate, RI (US); Mark D. Smith, San Jose, CA (US); John S. Graves, Austin, TX (US); David A. Blankenship, Austin, TX (US); Alessandro Vaglio Pret, Austin, TX (US)

(73) Assignee: KLA-Tencor Corporation, Milpitas, CA (US)

( * ) Notice: Subject to any disclaimer, the term of this patent is extended or adjusted under 35 U.S.C. 154(b) by 11 days.

(21) Appl. No.: 15/232,302

(22) Filed: Aug. 9, 2016

(65) Prior Publication Data

US 2018/0017873 A1    Jan. 18, 2018

Related U.S. Application Data

(60) Provisional application No. 62/363,041, filed on Jul. 15, 2016.

(51) Int. Cl.
*G03B 27/32* (2006.01)
*G03C 5/18* (2006.01)
(Continued)

(52) U.S. Cl.
CPC ............ *G03F 7/705* (2013.01); *G03F 7/30* (2013.01); *G03F 7/38* (2013.01); *G03F 7/70625* (2013.01)

(58) Field of Classification Search
CPC ..... G03F 7/30; G03F 7/32; G03F 7/38; G03F 7/70125; G03F 7/705; G03F 7/70625
(Continued)

(56) References Cited

U.S. PATENT DOCUMENTS 5,717,612 A    2/1998  Capodieci
5,889,686 A    3/1999  Mimotogi et al.
(Continued)

FOREIGN PATENT DOCUMENTS

JP    2007242710 A  *  9/2007
JP    2010192754 A  *  9/2010

OTHER PUBLICATIONS

International Search Report for PCT/US2017/042257 dated Oct. 25, 2017. pp. 3.
Written Opinion for PCT/US2017/042257 dated Oct. 25, 2017. pp. 5.
Biafore, J. J. et al., "Statistical simulation of resist at EUV and ArF", In: SPIE Proceedings vol. 7273: Advances in Resist Materials and Processing Technology XXVI, 727343 (Apr. 1, 2009).
(Continued)

*Primary Examiner* — Colin Kreutzer
(74) *Attorney, Agent, or Firm* — Meyertons, Hood, Kivlin, Kowert & Goetzel, P.C.

(57) ABSTRACT

In some embodiments, a method may include improving a development process of a photoresist. The method may include simulating a negative-tone development process of a photoresist. The method may include determining a reaction of a developer with a soluble photoresist surface. Determining the reaction of the developer may include applying a reaction rate constant at a power of a reaction order to a blocked polymer concentration to yield a resist dissolution rate of soluble resist comprising the dissolution-limited regime of development. The method may include determining a flux of the developer into exposed and partially soluble resist. Determining the flux of the developer may include applying a vector valued diffusion coefficient of the developer dependent upon the blocked polymer concentration to a gradient of developer concentration to an expan-
(Continued)

sion rate of insoluble resist comprising the expansion-controlled regime of development. The method may include optimizing an illumination source and a mask on a full chip.

34 Claims, 2 Drawing Sheets

(51) Int. Cl.
    *G06G 7/48*     (2006.01)
    *G03F 7/20*     (2006.01)
    *G03F 7/38*     (2006.01)
    *G03F 7/30*     (2006.01)

(58) Field of Classification Search
    USPC ............. 355/27, 67, 71, 77; 430/311, 434; 703/12; 716/50–54
    See application file for complete search history.

(56) References Cited

U.S. PATENT DOCUMENTS

| | | |
|---|---|---|
| 7,319,944 B2 | 1/2008 | Nakamura et al. |
| 8,786,824 B2 | 7/2014 | Hansen |
| 9,213,783 B2 | 12/2015 | Hansen |
| 2007/0212624 A1 | 9/2007 | Philippou et al. |
| 2010/0315614 A1 | 12/2010 | Hansen |
| 2013/0179847 A1 | 7/2013 | Hansen |
| 2016/0110488 A1 | 4/2016 | Hansen |

OTHER PUBLICATIONS

Komuro, Y. et al., "Modeling and simulation of acid generation in anion-bound chemically amplified resists used for extreme ultraviolet lithography", Japanese Journal of Applied Physics, vol. 54, 036506, internal pp. 1-7 (2015).

Mack, C.A., (1998), Modeling Solvent Effects in Optical Lithography, PhD Thesis, University of Texas, Austin.

I. Devotta, R. A. Mashelkar, (1996), 'Role of Thermodynamic and Kinetic Factors in Polymer Dissolution in Mixed Solvents', Chem. Eng. Communications, vol. 156—mathematical physics for polymer dissolution in the presence of organic solvents, but not photoresist dissolution.

Y.O. Tu, (1977), 'A Multi-Phase Stefan Problem Describing the Swelling and the Dissolution of Glassy Polymer', Quarterly of Applied Mathematics—mathematical physics for polymer dissolution in the presence of organic solvents, but not photoresist dissolution. Photoresists are light-sensitive amorphous mixtures which are in part functionalized polymers. Resist dissolution in the presence of organic solvents (which is NTD) is much more complex than dissolution of polymers alone.

Y.O. Tu, A. C. Ouano, (1977) 'Model for the Kinematics of Polymer Dissolution', IBM J. Res. Dev., 21, 131.

C. A. Mack, (1987), 'Development of Positive Photoresists', J. Electrochem Soc., vol. 134, 1—foundation of modern photoresist dissolution modeling—But ignores swelling and gel formation which are critical to accurate prediction of modern NTD photoresists.

\* cited by examiner

METHOD FOR COMPUTER MODELING AND SIMULATION OF NEGATIVE-TONE-DEVELOPABLE PHOTORESISTS

PRIORITY CLAIM

This application claims priority to U.S. Provisional Patent Application No. 62/363,041 filed on Jul. 15, 2016, which is incorporated by reference herein.

BACKGROUND OF THE INVENTION

1. Field of the Invention

The present disclosure generally relates to a method for simulation of the lithographic performance of chemically-amplified photoresists. More particularly, the disclosure generally relates to a method for the simulation of negative tone development processes including improving simulation accuracy, wherein the improved accuracy may be defined as a reduction in a numerical cost function that measures the agreement between simulated predictions and experimental data.

2. Description of the Relevant Art

Microlithography is a critical step in the manufacturing process of integrated circuits ("ICs"), where patterns formed on substrates define functional elements ("printed features") of the ICs, such as microprocessors, memory chips, flat panel displays, micro-electro mechanical systems ("MEMs") and other devices. As IC manufacturing processes advance, the dimensions of the functional elements has continually decreased while the number of elements per device has continually increased, a trend commonly described as "Moore's law". At the current state of technology, devices are manufactured using deep ultraviolet radiation to create individual functional elements having dimensions significantly below 100 nm, much less than the wavelength of the radiation (primarily 248 nm, 193 nm and 13.5 nm). The process in which features smaller than the classical resolution limit of a microlithographic apparatus is known as low $k_1$ lithography by the formula $$CD = k_1 \lambda / NA \quad (1)$$

where $\lambda$ represents the wavelength of radiation, NA represents the numerical aperture of the lithographic apparatus, CD represents the critical dimension or the minimum width of the printed features and $k_1$ is the resolution enhancement coefficient. The smaller $k_1$ is, the smaller the target dimensions of the printed feature and consequently the more difficult the process is to control in high volume manufacturing (HVM). To ensure that the printed feature is in accordance with the target pattern, sophisticated numerical models, describing the physical-chemical events that occur in each lithography process step, are run on extensive computational resources with the results used to predict the performance of the process and the fidelity of the printed features in photoresist. The lithographic process is known as microlithography and the computer methods used to simulate microlithography are known as optical lithography simulation methods or computational lithography.

Microlithography technology generally involves the steps of:
(1) Coating a substrate, usually a silicon wafer, with photoresist. Photoresists ("resists") are radiation-sensitive materials used in the manufacture of ICs. A photoresist forms a three-dimensional relief image on the substrate after irradiation ("exposure") and subsequent processing steps ("PEB" and "development").

(2) Irradiating the photoresist using a lithographic apparatus, usually a reduction camera ("scanner") that projects radiation through a photomask ("mask") on to a target area of the resist-coated substrate. The mask contains a much larger image of the pattern to be printed in the photoresist. The mask image is etched on a glass substrate and contains regions that are alternatingly opaque and transparent to the radiation. The scanner optics reduce the size of the image on the mask to about ¼ the original size on the mask and projects the reduced image into photoresist.

(3) The formation of a three-dimensional image in photoresist by a process that upon completion relieves, by the development process, either the irradiated portion of the photoresist (a "positive tone development process") or the un-irradiated portion (a "negative tone development process") of the photoresist.

If the irradiated portion of the resist is removed during the development step, the photoresist is known as a positive tone developable resist ("PTD resist"); conversely, if the unexposed portion of the resist is removed during development, the photoresist is known as a negative tone developable resist ("NTD resist").

The substrate will be further processed using for example steps of ion implant, etching[3], etc. The photoresist image is used to protect the areas on the substrate from some number of these subsequent processing steps. In this way, an IC device can be constructed layer-by-layer using many different and interconnected layers.

Photoresists work by converting the spatial distribution of energy, or the projected, reduced, energetic image of the mask inside the resist, into a spatial distribution of solubility in a developer. Modern microlithography processes depend upon chemically-amplified resists (CARs) that are most sensitive to deep UV radiation at wavelengths 248 nm, 193 nm and 13.5 nm. A state-of-the-art photoresist process consists of three main steps: exposure, post-exposure bake and development.

During exposure, a radiation-sensitive component in the resist (the "PAG" or "photo-acid generator") forms a latent image inside the photoresist film in response to irradiation. The kinetics of photoresist exposure depends largely upon the ability of the resist to absorb the incident radiation and the rate that photoproducts are produced in response to this absorption. Upon exposure to incident 248 nm, 193 nm or 13.5 nm radiation, the photoproduct produced by CARs is highly acidic; the chemical latent image produced in resist by irradiation therefore consists largely of acid. Acid generation in CARs first requires the absorption of energy in the form of light. The initiation of the photoreaction is provided by the absorption of light and leads to an electronically-excited state of the absorbing molecule, the PAG. The thermodynamically-favorable products which are accessible to the electronically-excited molecule are greater than those accessible to a ground-state molecule, since the excited molecule possesses excess energy as a result of absorption. The chronology of the exposure step can be divided into three stages: photon absorption and formation of the excited state, the primary or direct photochemical process, and the secondary or indirect process which occurs from the intermediates produced during the primary process:

$$PAG \xrightarrow{h\nu} PAG^*.$$

Photon absorption by the PAG and formation of the excited state $$P(H^+|PAG^*)=\phi_{photo}$$

The direct photochemical process: the probability that PAG* in an electronically excited state converts to acid is equal to the photolytic quantum efficiency $\phi_{photo}$ $$P(PAG|PAG^*)=1-\phi_{photo}$$

The indirect photochemical process: the probability that PAG* relaxes to the ground state PAG. The average rate of PAG decomposition when exposed to the actinic radiation can be expressed as a differential equation. The rate of conversion is proportional to the light intensity and the exposure rate constant C (cm²/mJ)

$$\frac{d[PAG]}{dt} = -CI[PAG] \quad (2)$$

Where [PAG] represents the concentration of the photoacid generator, t represents the time and I represents the intensity of light. The acid concentration H after exposure can be calculated by integrating both sides of the equation, yielding.

$$[H]=[PAG]_0(1-\exp(-CIt)) \quad (3)$$

Exposure of the resist using an image with intensity I results in an acid latent image [H]. The post-exposure bake ("PEB") step is then used to thermally induce a chemical reaction that, upon completion, changes the solubility of the resist. In modern CARs, this reaction results in the de-blocking of the polymer resin of either a positive-tone-developable resist (PTD) or negative-tone-developable resist (NTD). The concept of de-blocking a polymer to change its solubility in a basic developer was first proposed by Willson, Ito and Frechet. A base polymer resin, such as polyhydroxystyrene (PHS) is used; PHS is very soluble in an aqueous base developer solution used as positive-tone developers or very insoluble in the non-polar solvents used as negative-tone developers. It is carboxylic acid (COOH) groups that give PHS its high degree solubility in aqueous base solutions or insolubility in non-polar solvent developers. By 'blocking' these sites, with, for example with a t-butoxycarbonyl group (t-BOC), the solubility of PHS in aqueous base developer can be inhibited or the solubility of PHS in non-polar solvent developer can be promoted. In the presence of the strong acid produced by the exposure step and the heat applied during the PEB step, the t-BOC blocked polymer will undergo acidolysis to generate the carboxylic acid group.

The defining characteristic of a chemically-amplified resist (CAR) is that this reaction is catalyzed by the exposure-generated acid such that the acid is not consumed by the reaction and [H] remains about constant. Effectively each exposure event resulting in the creation of one acid molecule can cause a large number of solubility-changing chemical events during the PEB. The effects of exposure are said to be amplified by the catalytic nature of this chemical reaction. The de-blocking reaction can be expressed as a partial differential reaction-diffusion equation $$\frac{\partial[M]}{\partial t} = -k_{amp}[M][H]^n + D\nabla[H] \quad (4)$$

where [M] represents the concentration of blocked or unreacted sites on the polymer resin, [H] represents the concentration of acid produced by the exposure process, D the diffusion coefficient of the acid, $k_{amp}$ is the amplification reaction rate constant, and n is the reaction order.

It is important to note that [M] decreases as the acid concentration [H] increases, either due to greater intensity in the projection image, a longer exposure time or a larger C parameter. In a PTD process, lower values of [M] produce more solubility in aqueous base developer solution and it is the unexposed regions of the resist that form the final relief image. The concentration of [M] therefore acts as a dissolution inhibitor in PTD processes. In an NTD process, lower values of [M] produce less solubility in non-polar organic solvent developer and it is the exposed regions of the resist that form the final relief image. The concentration of [M] therefore acts as a dissolution promoter in NTD processes.

As stated above, resists are designed to turn a spatial distribution of energy into a spatial distribution of solubility. During the development process, the substrate containing the exposed and post-exposure-baked photoresist image is immersed in a liquid developer. The nature of the developer solution depends on the development tone of the resist process. In the case of a positive-tone-develop process, the developer solution consists of aqueous base and the areas of the resist that have been irradiated (exposed) are soluble. Lower values of [M] produce more solubility in aqueous base developer solution and it is the unexposed regions of the resist that form the final relief image. The concentration of [M] therefore acts as a dissolution inhibitor in PTD processes. In the case of a negative-tone-develop resist process (an NTD photoresist), the developer solution consists of a non-polar organic solvent and the areas of the resist that have not been irradiated are soluble. In an NTD process, lower values of [M] produce less solubility in non-polar organic solvent developer and it is the exposed regions of the resist that form the final relief image. The concentration of [M] therefore acts as a dissolution promoter in NTD processes. The exposure and post-exposure bake steps create latent images of chemical concentrations, but it is the process of dissolution that has the greatest impact on the resists ability to discern between light and dark and to control the dimensions of the final features in resist.

SUMMARY

In some embodiments, a method may include simulating a development process of a photoresist. The method may include simulating a negative-tone development process of a photoresist. The method may include determining a reaction of a developer with a soluble photoresist surface. Determining the reaction of the developer may include applying a reaction rate constant at a power of a reaction order to a blocked polymer concentration to yield a resist dissolution rate of soluble resist comprising the dissolution-limited regime of development. The method may include determining a flux of the developer into exposed and partially soluble resist. Determining the flux of the developer may include applying a vector valued diffusion coefficient of the developer dependent upon the blocked polymer concentration to a gradient of developer concentration to an expansion rate of insoluble resist comprising the expansion-controlled regime of development. In some embodiments, the method may include the optimization of the illumination source and the mask in an area comprising the full chip. In some embodiments, the method may include forming an integrated circuit using the full chip optimization of the source and the mask.

In some embodiments, the development process of photoresists comprises a negative-tone development process. In some embodiments, the development process of photoresists comprises a positive-tone development process.

In some embodiments, the development process of photoresists comprises photoresists used for 248 nm (KrF), 193 nm (ArF) or 13.5 nm (EUV) lithography.

In some embodiments, applying the reaction rate constant ($k_R$) to the blocked polymer concentration (m)$k_R$(m)$^n$ at the power of the reaction order (n) to the dissolution rate of soluble resist ($R_D$) is equivalent to $k_R$(m)$^n$.

In some embodiments, determining a flux ($j_S$(r,t)) of the developer into exposed and partially soluble resist is determined by applying a vector-valued diffusion coefficient ($D_S$) of the developer dependent upon the blocked polymer concentration (m) is applied to a gradient of the developer concentration ($\nabla S$) at a point r and time t such that $$j_S(r,t) = -D_S(m)\nabla S(r,t).$$

In some embodiments, the dissolution-controlled regime applies when the photoresist surface is at least partially soluble to the developer. In some embodiments, the expansion-controlled regime applies when the photoresist surface is substantially insoluble to the developer. The expansion-controlled regime may apply when the photoresist surface is substantially insoluble to the developer such that the developer continues to absorb into the photoresist increasing the volume of the photoresist. The dissolution-controlled regime may be transitioned to the expansion-controlled regime at a gel point dose.

In some embodiments, the method of simulating the development process of photoresists comprises stochastically simulating the development process of photoresists.

In some embodiments, the method may include correcting the full-chip optical proximity of a mask. The method may include the placement and verification of a mask sub-resolution assist feature on a full chip. The method may include repairing a mask sub-resolution assist feature. The method may include inspecting a full chip mask inspection. The method may include identifying, diagnosing, and/or repairing a mask hot-spot. The method may include optimizing a full chip source-mask.

BRIEF DESCRIPTION OF THE DRAWINGS

Advantages of the present invention may become apparent to those skilled in the art with the benefit of the following detailed description of the preferred embodiments and upon reference to the accompanying drawings.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

The headings used herein are for organizational purposes only and are not meant to be used to limit the scope of the description. As used throughout this application, the word "may" is used in a permissive sense (i.e., meaning having the potential to), rather than the mandatory sense (i.e., meaning must). The words "include," "including," and "includes" indicate open-ended relationships and therefore mean including, but not limited to. Similarly, the words "have," "having," and "has" also indicated open-ended relationships, and thus mean having, but not limited to. The terms "first," "second," "third," and so forth as used herein are used as labels for nouns that they precede, and do not imply any type of ordering (e.g., spatial, temporal, logical, etc.) unless such an ordering is otherwise explicitly indicated. For example, a "third die electrically connected to the module substrate" does not preclude scenarios in which a "fourth die electrically connected to the module substrate" is connected prior to the third die, unless otherwise specified. Similarly, a "second" feature does not require that a "first" feature be implemented prior to the "second" feature, unless otherwise specified.

Various components may be described as "configured to" perform a task or tasks. In such contexts, "configured to" is a broad recitation generally meaning "having structure that" performs the task or tasks during operation. As such, the component can be configured to perform the task even when the component is not currently performing that task (e.g., a set of electrical conductors may be configured to electrically connect a module to another module, even when the two modules are not connected). In some contexts, "configured to" may be a broad recitation of structure generally meaning "having circuitry that" performs the task or tasks during operation. As such, the component can be configured to perform the task even when the component is not currently on. In general, the circuitry that forms the structure corresponding to "configured to" may include hardware circuits.

Various components may be described as performing a task or tasks, for convenience in the description. Such descriptions should be interpreted as including the phrase "configured to." Reciting a component that is configured to perform one or more tasks is expressly intended not to invoke 35 U.S.C. § 112 paragraph (f), interpretation for that component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

It is to be understood the present invention is not limited to particular devices or biological systems, which may, of course, vary. It is also to be understood that the terminology used herein is for the purpose of describing particular embodiments only, and is not intended to be limiting. As used in this specification and the appended claims, the singular forms "a", "an", and "the" include singular and plural referents unless the content clearly dictates otherwise. Thus, for example, reference to "a linker" includes one or more linkers.

DETAILED DESCRIPTION

Definitions

Unless defined otherwise, all technical and scientific terms used herein have the same meaning as commonly understood by one of ordinary skill in the art.

The term "connected" as used herein generally refers to pieces which may be joined or linked together.

The term "coupled" as used herein generally refers to pieces which may be used operatively with each other, or joined or linked together, with or without one or more intervening members.

The term "directly" as used herein generally refers to one structure in physical contact with another structure, or, when used in reference to a procedure, means that one process effects another process or structure without the involvement of an intermediate step or component.

Improving Negative and Positive Tone Development in a Chemically-Amplified Photoresist:

The classical method for simulation of resist dissolution, derived predominantly by Mack has been applied to PTD resists, typically with very good results, and more lately to NTD resists, with much poorer results. The recent use of the classical method for the simulation of the NTD resist dissolution process is generally referred to as the "inverse Mack" method.

In the classical method as applied to PTD resist processes, three steps are considered
1. The diffusion of the developer to the photoresist surface
2. The reaction of the developer with the photoresist at the resist surface
3. The diffusion of the dissolved photoresist back into the developer.

The first step, the rate of the diffusion of developer to the resist surface, is described $$r_D = k_d S \quad (5)$$

where $r_D$ is the rate of diffusion of the developer to the resist surface, S is the concentration of the active basic molecule in the aqueous developer solution at the resist surface (typically tetramethylammonium hydroxide, TMAH), and $k_d$ is the rate constant. As described above, in a PTD resist process, higher concentrations of blocked sites on the resin polymer [M] act as dissolution inhibitors and n inhibitor sites in the exposed region must be removed for a molecule of the resin to fully dissolve, in the sense that to be fully dissolved, a molecule of the resist resin must be surrounded by molecules of the developer.

The second step, reaction of the developer with the resist at the resist surface is described $$r_R = k_r S(M_0 - M)^n \quad (6)$$

where $r_R$ is the rate of reaction of the developer with the resist at the resist surface, S is the concentration of developer at the resist surface, $k_r$ is the reaction rate constant, $M_0$ is the initial concentration of the inhibitor and n is the reaction order.

The third step, diffusion of the dissolved resist back into developer, occurs quickly enough that this step may be ignored. The rate equations occur in series, step two follows step one, and the two steps will come to a steady state such that the overall dissolution rate $R_{PTD}$ for a PTD resist is $$R_{PTD} = r_D = r_r \quad (7)$$

Equating the two rate equations allows cancellation of S and the PTD dissolution rate $R_{PTD}$ can be written $$R_{PTD} = \frac{r_r}{r_D} = \frac{k_r S(M_0 - M)^n}{k_d S} = \frac{k_r}{k_d}(M_0 - M)^n = k_R(M_0 - M)^n \quad (8)$$

where $$k_R = \frac{k_r}{k_d}.$$

Letting $m = M/M_0$, where m is the relative dissolution inhibitor concentration, the equation for $R_{PTD}$ becomes $$R_{PTD} = k_R(1-m)^n \quad (9)$$

where the rate is proportional to (1−m) and where (1−m) represents the extent of polymer de-blocking.

The classical theory has more recently been applied to modern NTD resist systems with very only minor changes to the PTD dissolution rate equation. Called the 'inverse Mack method', m simply acts as a dissolution promoter, giving $$R_{NTD} = k_R(m)^n \quad (10)$$

where the negative tone dissolution rate $R_{NTD}$ is proportional to m and where m represents the extent of polymer blocking.
Improved Method of Simulating Negative and Positive Tone Development in a Chemically-Amplified Photoresist:

In NTD systems, higher values of m produce faster dissolution rates, while lower values of m, where light intensity is greater, produce slower dissolution rates. As the light intensity or more appropriately, the exposure dose increases, the NTD dissolution rate slows until the gel-point dose is encountered. At the gel point dose, the resist film becomes partially insoluble. At doses above the gel-point dose, an increasing fraction of the resist is insoluble, but the insoluble resist may continue to take up developer, purely driven by the effects of diffusion of developer into partially insoluble resist. The rate that developer diffuses into insoluble resist is proportional to the local value of m and therefore to the exposure dose and the local acid concentration.

When applied to NTD processes, the classical method, as described above, does not account for the lithographic effects produced by the continued diffusion of the developer into insoluble resist. The failure to account for at least these effects in computational lithography models of NTD processes severely degrades modeling accuracy, rendering the classical method inadequate for simulation of NTD resist processes.

In some embodiments, a method for the simulation of NTD, may include two processes considered
1. The reaction of the developer with the photoresist at the resist surface
2. The flux of the developer into exposed and partially insoluble resist In some embodiments, a method may include improving through, for example, simulating a development process of a photoresist. The method may include simulating a negative-tone development process of a photoresist. The method may include determining a reaction of a developer with a soluble photoresist surface. The method may include determining a flux of the developer into exposed and partially soluble resist. In some embodiments, the method may include development process of photoresists comprises a positive-tone development process.

In some embodiments, the development process of photoresists comprises photoresists used for different wavelength lithography. In some embodiments, the development process of photoresists comprises photoresists used for 248 nm (KrF), 193 nm (ArF) and/or 13.5 nm (EUV) lithography.

In some embodiments, a reaction of the developer with the resist at the resist surface is as described in the classical method above $$R_{NTD} = k_R(m)^n \quad (11)$$

where $R_{NTD}$ is the rate of reaction of the developer with the resist at the resist surface and is the dissolution rate of soluble resist, $k_R$ is the reaction rate constant, m is the normalized concentration of the NTD dissolution promoter, a function of the exposure dose and the local acid concentration and n is the reaction order. In NTD processes, the developer is, for example, a pure organic non-polar solvent, for example n-butylacetate and not an aqueous base solution as in PTD processes.

In some embodiments, determining the reaction of the developer may include applying a reaction rate constant at a power of a reaction order to a blocked polymer concentration to yield a resist dissolution rate of soluble resist comprising the dissolution-limited regime of development.

In some embodiments, as the exposure dose increases, m decreases, inhibiting or slowing the dissolution rate. Therefore, $R_{NTD}$ decreases as exposure dose increases until the gel point dose is encountered. At the gel point dose, the photoresist becomes partially insoluble; at and above the gel point dose, larger and larger fractions of the resist become insoluble, yet the developer may continue to enter the resist, driven purely by diffusion. In some embodiments, the rate that developer diffuses into the partially insoluble resist is described as a flux with units of m/s $$j_S(r,t) = -D_S \nabla S(r,t) \quad (12)$$

where $j_S$ is the flux of developer passing through any point r inside the undissolved resist at time t, $D_S$ is the vector-valued diffusion coefficient of the developer in units of m²/s and $\nabla S$ is the gradient of the developer concentration at a point r and time t inside the resist. The sign of the diffusion coefficient is chosen to indicate that the direction of diffusion is into the photoresist mass. The diffusion coefficient's value in relation to the concentration of blocked or unreacted sites on the photoresist resin is highly complex yet can be estimated by consideration of both polymer solution thermodynamics and percolation theory.

In some embodiments, determining the flux of the developer may include applying a vector valued diffusion coefficient of the developer dependent upon the blocked polymer concentration to a gradient of developer concentration to an expansion rate of insoluble resist comprising the expansion-controlled regime of development.

For example, Flory-Huggins theory characterizes the thermodynamic compatibility between a polymer and a solvent as $$D = \text{const}(1-\phi_1)^2(1-2\chi\phi_1) \quad (13)$$

where D is the mutual binary diffusion coefficient in a polymer/solvent system, $\phi_1$ is the developer volume fraction in the solution and $\chi$ is the thermodynamic polymer-solvent interaction parameter. With respect to NTD photoresists, $\chi$ represents the thermodynamic compatibility between the polymer resin and the developer, a function of the polymer blocking extent and the molecular volume of the developer species.

Percolation theory is a branch of mathematics which deals with such phenomena as the formation of connected holes and channels called percolation clusters. The concentration of hydrophilic percolation clusters in NTD photoresists is highly dose-dependent. For example, at higher doses, more reactive sites are de-blocked on the photoresist resin polymer by the diffusing photo-acid. The products of the de-blocking reaction are partially volatile, leaving behind free volume, which effectively are holes and channels in the photoresist through which the developer may diffuse.

The boundary between undissolved or insoluble resist above the gel point dose and the liquid developer will be represented by Γ; for example, in 2 dimensions, Γ is a line; in 3 dimensions, Γ is a surface; Γ represents the photoresist edge. One is interested in the rate, the direction and the amount Γ is displaced over a time interval as a response to the diffusion of the developer into insoluble photoresist.

The displacement of Γ occurs at a velocity equivalent in magnitude to $j_S$, yet in a direction opposite $j_S$ $$R_{IEV}(r,t)|_\Gamma = -j_S(r,t) \quad (14)$$

where $R_{IEV}(r,t)|_\Gamma$ represents the insoluble edge velocity calculated at any point and at any time on Γ. The displacement of the edge $\Gamma_d$ over a time interval may be expressed as an integral $$\Gamma_d = \int_t^{t+\Delta t} R(r,t)\Big|_\Gamma dt \quad (15)$$

Or it may be expressed as an ordinary differential equation subject to the boundary condition $\Gamma_d(t)=0$ $$\frac{d\Gamma_d(r,t)}{dt} = R(r,t)|_\Gamma \quad (16)$$

The overall edge velocity $\vec{V}(r,t)$ at any point r on Γ and at any time t during the negative tone development process can therefore be expressed as the sum of the classical dissolution velocity $R_{NTD}$ and the insoluble edge velocity $R_{IEV}$ $$\vec{V}(r,t)|_\Gamma = (\vec{R}_{NTD}(r,t) + \vec{R}_{IEV}(r,t))|_\Gamma \quad (17)$$

In some embodiments, significantly below the gel point dose, the photoresist is underexposed, m~1 and the resist is highly soluble. In this case, classical inverse Mack dissolution theory largely determines the location, speed and direction Γ propagates during development, since $$\|R_{NTD}(r,t)\| \gg \|R_{IEV}(r,t)\|, \text{ dose} < \text{dose}_{gel} \quad (18)$$

and the negative tone development process is said to be dissolution-controlled $$\text{dissolution-controlled } \|\vec{V}(r,t)\| \approx \|R_{NTD}(r,t)\|,$$
$$\text{dose} < \text{dose}_{gel} \quad (19)$$

In some embodiments, at and above the gel point dose, the photoresist is much more exposed, has absorbed more incident radiation, has produced more photo-generated acid, m<<1 and is therefore much less soluble. This may cause the classical dissolution rate $R_{NTD}(r,t)$ to approach zero. However, due to the diffusive processes described above, developer continues to enter the photoresist, increasing the volume of the resist mass and perturbing the location of the edge Γ.

$$\|R_{NTD}(r,t)\| < \|R_{IEV}(r,t)\|, \text{ dose} \geq \text{dose}_{gel} \quad (20)$$

In some embodiments, the dissolution-controlled regime applies when the photoresist surface is at least partially soluble to the developer.

The negative tone development process switches from the dissolution-controlled regime to the expansion-controlled regime $$\text{expansion-controlled } \|\vec{V}(r,t)\| \approx \|R_{IEV}(r,t)\|, \text{ dose} \geq \text{dose-gel} \quad (21)$$

In some embodiments, the expansion-controlled regime of NTD development strongly influences the lithographic behavior of NTD processes in a way not observed in PTD processes. Ignoring simulation of the effect severely degrades the accuracy of computational lithography modeling of NTD processes, as is shown below.

In some embodiments, the expansion-controlled regime applies when the photoresist surface is substantially insoluble to the developer. The expansion-controlled regime applies when the photoresist surface is substantially insoluble to the developer such that the developer continues to absorb into the photoresist increasing the volume of the photoresist. In some embodiments, the dissolution-controlled regime is transitioned to the expansion-controlled regime at a gel point dose.

Figure 1:
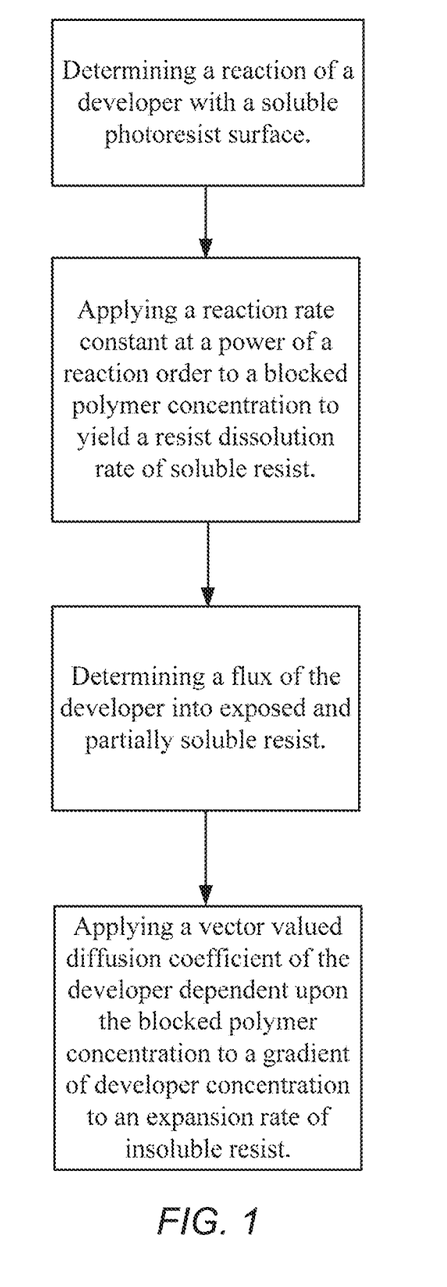
FIG. 1 depicts a diagram of a flowchart of a method of improving a development process of a photoresist.

FIG. 1 depicts a diagram of a flowchart of a method of improving a development process of a photoresist. Due to the continuous shrinking in half pitch and critical dimension in wafer processing, maintaining a reasonable process window such as depth of focus and exposure latitude becomes very challenging. With the source mask optimization methodology, the lithography process window can be improved and a smaller mask error enhancement factor can be achieved.

In order to improve resolution performance of a lithographic system, various tools may be used. Recent developments in illumination systems include freely tunable illumination sources. Freely tunable illumination sources may provide illumination shapes that are nearly arbitrarily defined, thereby allowing even finer controls over illumination patterns. Illumination shapes of any complexity may be produced by simple apertures, gray-tone plates, or diffractive optical elements. Projection optics may include optical components for shaping, adjusting and/or projecting radiation from the source before the radiation passes the patterning device, and/or optical components for shaping, adjusting and/or projecting the radiation after the radiation passes the patterning device. In light of recent developments that provide an increasing number of tuning and adjustment options for both illumination sources and masks, approaches for determining the optimal combination of source and mask configuration are desired. In some embodiments, using the simulation methods described herein may allow for improved source-mask optimization SMO of illumination source (a scanner) and mask as discussed for example in U.S. Pat. No. 9,213,783 to Hansen, U.S. patent application publication no. 20160110488 to Hansen, and U.S. Pat. No. 8,786,824 to Hansen, all of which are incorporated by reference herein.

In some embodiments, the method may include optimizing a full chip source-mask. In some embodiments, the method may include forming an integrated circuit using the full chip source-mask.

In some embodiments, the method may include correcting the full-chip optical proximity of a mask. The method may include the placement and verification of a mask sub-resolution assist feature on a full chip. The method may include repairing a mask sub-resolution assist feature. The method may include inspecting a full chip mask inspection. The method may include identifying, diagnosing, and/or repairing a mask hot-spot. The method may include optimizing a full chip source-mask.

Experimental Data

I. Measuring the Agreement Between Simulated Predictions and Experimental Data

Suppose that one is fitting N data points $(x_i, y_i), i=1 \ldots, N$ to a model that has M adjustable parameters $a_j, j=1 \ldots, M$. The model predicts a functional relationship between the measured independent and dependent variables $$y(x) = y(x | a_1 \ldots a_M) \quad (22)$$

where the vertical bar indicates dependence on the parameters on the right side. What does one want to minimize to get fitted values for the $a_j$'s? The first thing that comes to mind is the familiar least-squares fit $$\text{minimize over } a_1 \ldots a_M : \sum_{i=1}^{N} [y_i - y(x_i | a_1 \ldots a_M)]^2 \quad (23)$$

Data consists of a sample of observations drawn from a parent distribution that determines the probability of making any particular observation. Given a particular set of parameters, what is the probability that the observed data should have occurred, plus or minus some small fixed $\Delta y$ on each data point? If the probability of obtaining the data set is too small, then one concludes that the parameters under consideration are unlikely to be correct. The data set should not be too improbable for the correct choice of parameters. Suppose each data point $y_i$ has a measurement error that is independently random and distributed normally around the "true" $y(x)$. For simplicity, suppose that the standard deviation $\sigma$ of these normal distributions is the same for all data points. Then the probability of the data set is the product of the probabilities of each point:

$$P(\text{data} | \text{model}) \propto \prod_{i=1}^{N} \left\{ \exp\left[ -\frac{1}{2}\left(\frac{y_i - y(x_i)}{\sigma}\right)^2 \right] \Delta y \right\} \quad (24)$$

The most probable model is the one which maximizes this equation which is equivalent to minimizing the argument in the exponential $$\left[ \sum_{i=1}^{N} \frac{[y_i - y(x_i)]^2}{2\sigma^2} \right] - N \log \Delta y \quad (25)$$

Since N, $\sigma$, and $\Delta y$ are all constants, minimizing this equation is equivalent to minimizing $$\sum_{i=1}^{N} [y_i - y(x_i | a_1 \ldots a_M)]^2 \quad (26)$$

One therefore identifies the probability of the data given the parameters as the likelihood of the parameters given the data. Parameters derived this way are called maximum likelihood estimators. If each data point $(x_i, y_i)$ has its own, known standard deviation $\sigma_i$ then the maximum likelihood estimate of the model parameters may be obtained by minimizing the sum in the above formula, commonly referred to as chi-square or, upon dividing by the degrees of freedom, the reduced chi-square $$\chi^2 = \sum_{i=1}^{N} \left[\frac{y_i - y(x_i \mid a_1 \ldots a_M)}{\sigma_i}\right]^2 \quad \chi^2_{reduced} = \frac{\chi^2}{\nu} \qquad (27)$$

with $\nu = N - M$ degrees of freedom. Chi-square has no units, it is a pure number. A rule of thumb is that a typical value for a good fit is $\chi^2 \approx \nu$ or $\chi^2_{reduced} \approx 1$. More precise is the statement that the $\chi^2$ statistic has a mean $\nu$ and a standard deviation $\sqrt{2\nu}$ and for large $\nu$ becomes normally distributed. Taking the derivative of chi-square with respect to the parameters $a_j$ one obtains the equations that must hold at the chi-square minimum, which are a set of M nonlinear equations for the M unknown $a_j$:

$$0 = \sum_{i=1}^{N} \left(\frac{y_i - y(x_i)}{\sigma_i^2}\right)\left(\frac{\partial y(x_i \mid \ldots a_j \ldots)}{\partial a_j}\right) j = 1, \ldots, M \qquad (28)$$

The root mean square of the error (RMSE) between simulated predictions and experimental data, also a maximum likelihood estimator, is derived similarly, with units of the RMSE identical to the units of the experimental data; smaller values of RMSE indicate better agreement between simulated predictions and experimental data.

$$RMSerr = \left(\frac{1}{N}\sum_{i=1}^{N} [y_i - y(x_i \mid a_1 \ldots a_M)]^2\right)^{\frac{1}{2}} \qquad (29)$$

Comparison of Modeling Error: the Classical Method Vs. the Improved Method for Simulating Negative Tone Development of a Chemically-Amplified Photoresist Two calibrated computational lithography models differing in the method used for simulating the negative tone development process were used to predict the critical dimensions of the photoresist relief image after completion of the development process (the "after-develop image" or "ADI"). The computational lithography models differ in their treatment of the negative tone development process—one model includes support for the simulation of both dissolution-controlled and expansion-controlled development (the improved NTD modeling approach), while the other includes support for the simulation of dissolution-controlled development only (the classical inverse Mack approach). The set of experimental data used to evaluate the performance of each approach is exactly identical. The data have been collected by measuring the critical dimensions of lithographic features produced using a state-of-the-art NTD photoresist. The critical dimensions have been collected as a function of scanner exposure dose, scanner focus, mask feature width, mask feature pitch and feature tone. In NTD processes, opaque mask features print as spaces or holes in resist, while transparent mask features print as lines or posts. The set of data describing features collected using a single mask feature width and tone, a single mask feature pitch and multiple dose and focus values is referred to as a focus-exposure matrix (FEM). Each FEM is simulated using both models. The model predictions are then compared to the experimental data using the method of maximum likelihood. The goodness of model fit is quantified and shown in the tables below for the classical inverse Mack method and the improved method for simulating negative tone development, which accounts for both dissolution-controlled and expansion-controlled processes during development. The top row of the table lists the overall model error vs. experimental data, including the RMS error and the reduced chi-square, described above. Table 1 shows the best results obtained for the computational lithography model using the classical inverse Mack method to simulate negative tone development; the RMS error of this approach is 6.78 nm, and the reduced chi-square is 36.62.

TABLE 1 results using the classical inverse Mack approach
Calibration Statistics:

| Output/Group Name | Weight | Points | RMS Error | Average Absolute Error | Average Error | Max Error | Chi-Square Reduced | F Reduced |
|---|---|---|---|---|---|---|---|---|
| Group | | 402 | 6.775882 | 5.803183 | −0.3317238 | 21.85167 | 39.61736 | 39.61736 |
| 65S120P__L:Y:ADI CD (nm) | 1 | 45 | 5.519484 | 4.692963 | −3.472284 | 21.26267 | 32.80157 | |
| 65S120P__S:Y:ADI CD (nm) | 1 | 45 | 5.273606 | 4.31964 | 3.048798 | 21.85167 | 33.4935 | |
| 66L150P__L:Y:ADI CD (nm) | 1 | 48 | 6.51887 | 5.869005 | −4.78983 | 16.77435 | 30.38408 | |
| 66L150P__S:Y:ADI CD (nm) | 1 | 48 | 6.063706 | 5.336473 | 4.125926 | 17.28848 | 42.14913 | |
| 80S200P__L:Y:ADI CD (nm) | 1 | 66 | 8.004296 | 6.990122 | −4.121093 | 19.75455 | 42.18098 | |
| 80S200P__S:Y:ADI CD (nm) | 1 | 60 | 7.720978 | 6.56885 | 3.767708 | 20.77959 | 39.78538 | |
| 85L200P__L:Y:ADI CD (nm) | 1 | 45 | 7.103975 | 6.136977 | −4.963214 | 12.59775 | 38.98001 | |
| 85L200P__S:Y:ADI CD (nm) | 1 | 45 | 6.588597 | 5.729033 | 4.152123 | 11.54474 | 56.35861 | |

Table 1 shows the best results obtained for the computational lithography model using the classical inverse Mack method to simulate negative tone development; the RMS error of this approach is 6.78 nm, and the reduced chi-square is 36.62.

is measured in units equivalent to the radiation intensity measured at the wafer per unit area per unit time multiplied by the time required for exposure $$\text{sizing dose} = I \cdot t \qquad (30)$$

TABLE 2 results using the improved approach
Calibration Statistics:

| Output/Group Name | Weight | Points | RMS Error | Average Absolute Error | Average Error | Max Error | Chi-Square Reduced | F Reduced |
|---|---|---|---|---|---|---|---|---|
| Group | | 402 | 2.015629 | 1.540161 | −0.378552 | 6.508347 | 2.886436 | 2.886436 |
| 65S120P_L:Y:ADI CD (nm) | 1 | 45 | 1.830041 | 1.421631 | 0.1654438 | 6.508347 | 3.626313 | |
| 65S120P_S:Y:ADI CD (nm) | 1 | 45 | 1.832103 | 1.516736 | −0.5903961 | 5.810532 | 3.391773 | |
| 66L150P_L:Y:ADI CD (nm) | 1 | 48 | 1.231472 | 0.7955651 | −0.4842105 | 5.271576 | 0.9526621 | |
| 66L150P_S:Y:ADI CD (nm) | 1 | 48 | 1.092839 | 0.7300282 | −0.179841 | 4.314445 | 1.667326 | |
| 80S200P_L:Y:ADI CD (nm) | 1 | 66 | 2.723076 | 2.322778 | −0.8973885 | 5.897751 | 4.639248 | |
| 80S200P_S:Y:ADI CD (nm) | 1 | 60 | 2.714341 | 2.356389 | −0.09091084 | 6.342537 | 4.023414 | |
| 85L200P_L:Y:ADI CD (nm) | 1 | 45 | 1.686716 | 1.28823 | −0.3245471 | 5.285645 | 1.799993 | |
| 85L200P_S:Y:ADI CD (nm) | 1 | 45 | 1.775586 | 1.356279 | −0.4865245 | 6.355682 | 2.003978 | |

Table 2 shows the best results obtained for the computational lithography model using the improved method to simulate negative tone development; the RMS error of this approach is 2.01 nm, and the reduced chi-square is 2.89. The improved method is shown to reduce the RMS error by a factor of 3.4, meaning that modeling error using the improved method is in this example 3.4 times better than that obtained with the classical method under identical conditions.

Figure 2:
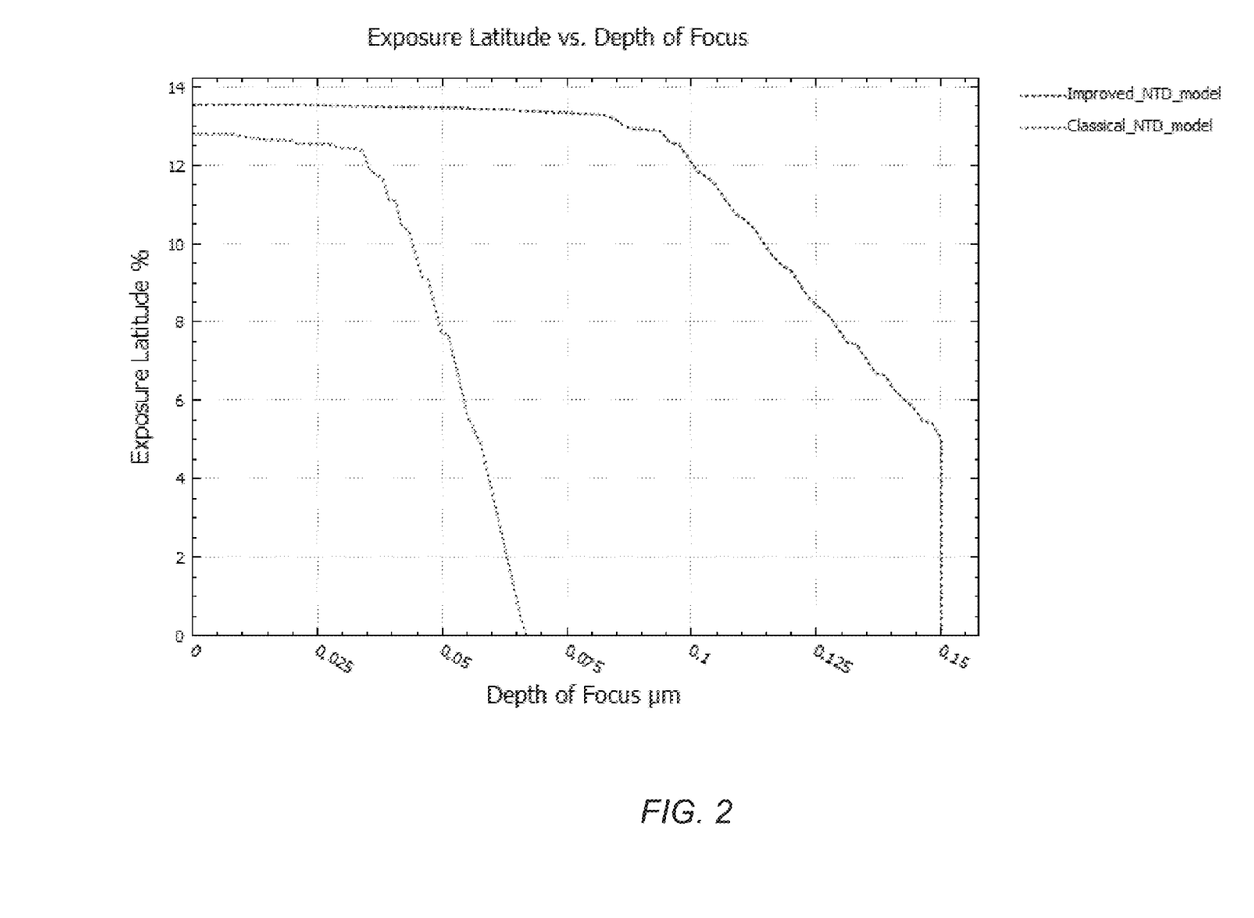
FIG. 2 depicts predicted lithographic results, ADI, using the improved approach vs. the classical approach for simulating negative-tone development. The improved method is shown to predict much larger process latitude, especially with respect to depth-of-focus, than the classical method.

II. Applications of the Improved Method for Simulating Negative Tone Development in a Chemically-Amplified Photoresist Corrected Predictions of Enhanced Lithography Process Window Expansion phenomena during the negative-tone development process results in profound improvement to ADI lithography, particularly with respect to spaces or holes. As an example, consider simulation of a lithographic process printing 40 nm spaces in photoresist on 120 nm mask pitch using 193 nm radiation and a state-of-the-art 1.35 NA scanner with off-axis illumination. Shown below is a plot of comparative exposure latitude vs. depth-of-focus, a typical metric used to evaluate the magnitude of the process window, for two computational lithography models: the improved method for simulation of negative tone development, supporting simulation of both the dissolution-controlled and expansion-controlled regimes of development\ vs. the classical "inverse Mack" method for simulation of negative tone development, supporting simulation of the dissolution-controlled regime only. The models used are calibrated with precision exhibited in Tables 1 and 2. The improved modeling method, able to predict experimental results within a RMS error of about 2 nm, predicts a process with maximum exposure latitude of 13.4%, maximum depth-of-focus (DOF) of ca. 150 nm, at a sizing dose of 35.8 mJ/cm$^2$; the classical method, able to predict experimental results within a RMS of about 7 nm, predicts maximum exposure latitude of 12.8%, maximum depth-of-focus of ca. 57 nm, at a sizing dose of 51.8 mJ/cm$^2$. The improved modeling method predicts a process with 2.6× greater focus latitude (DOF) compared to the classical method.

Corrected Predictions of Process Throughput

The throughput or speed of wafer processing depends to a large extent upon the sizing dose of the photoresist, or the amount of energy required to produce the proper dimension of the photoresist feature; the sizing dose of the photoresist where I is the intensity of the radiation in units of mJ/(cm$^2$·s) and t is the exposure time in seconds. IN NTD processes, larger values of dose correspond to smaller space CDs and larger line CDs—line CD increases and space CD decreases as dose increases. Smaller values of the sizing dose indicate a resist process with faster throughput, since wafers spend less time being exposed in the scanner. A smaller sizing dose therefore increases the rate of high volume manufacturing or the number of wafers processed per unit time. Including the improved method for simulating NTD development predicts a sizing dose of 35.8 mJ/cm$^2$; the classical method predicts a sizing dose of 51.8 mJ/cm$^2$ for the same feature.

It is clear that including simulation of the expansion-controlled regime of negative-tone development produces a more accurate computational lithography model, as evidenced by Tables 1 and 2 above. Using the improved method, modeling error is reduced by a factor of 3.5 compared to the classical method. Lower modeling error means more accurate predictions. The improved model can then be exploited to give a truer picture of the process window, in this case a process window much larger than that predicted by the classical method, evidenced by FIG. 2, and a more accurate prediction of faster manufacturing throughout, as evidenced by the prediction of the sizing dose.

In this patent, certain U.S. patents, U.S. patent applications, and other materials (e.g., articles) have been incorporated by reference. The text of such U.S. patents, U.S. patent applications, and other materials is, however, only incorporated by reference to the extent that no conflict exists between such text and the other statements and drawings set forth herein. In the event of such conflict, then any such conflicting text in such incorporated by reference U.S. patents, U.S. patent applications, and other materials is specifically not incorporated by reference in this patent.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A method of optimizing a mask, comprising:
simulating a development process of a photoresist, comprising:
determining a reaction of a developer with a soluble photoresist surface comprising:
applying a reaction rate constant at a power of a reaction order to a blocked polymer concentration to yield a resist dissolution rate of soluble resist comprising a dissolution-limited regime of development; and
determining a flux of the developer into exposed and partially soluble resist comprising:
applying a vector valued diffusion coefficient of the developer dependent upon the blocked polymer concentration to a gradient of developer concentration to an expansion rate of insoluble resist comprising a expansion-controlled regime of development;
providing a result from the simulation for use in optimizing and forming a mask.

2. The method of claim 1, wherein the development process of photoresists comprises a negative-tone development process.

3. The method of claim 1, wherein the development process of photoresists comprises a positive-tone development process.

4. The method of claim 1, wherein the development process of photoresists comprises photoresists used for 248 nm (KrF), 193 nm (ArF) or 13.5 nm (EUV) lithography.

5. The method of claim 1, wherein applying the reaction rate constant ($k_R$) to the blocked polymer concentration (m)$k_R$(m)$^n$ at the power of the reaction order (n) to the dissolution rate of soluble resist ($R_D$) is equivalent to $k_R(m)^n$.

6. The method of claim 1, wherein determining a flux ($j_S(r,t)$) of the developer into exposed and partially soluble resist is determined by applying a vector-valued diffusion coefficient ($D_S$) of the developer dependent upon the blocked polymer concentration (m) is applied to a gradient of the developer concentration ($\nabla S$) at a point r and time t such that $$j_S(r,t)=-D_S(m)\nabla S(r,t).$$

7. The method of claim 1, wherein the dissolution-controlled regime applies when the photoresist surface is at least partially soluble to the developer.

8. The method of claim 1, wherein the expansion-controlled regime applies when the photoresist surface is substantially insoluble to the developer.

9. The method of claim 1, wherein the expansion-controlled regime applies when the photoresist surface is substantially insoluble to the developer such that the developer continues to absorb into the photoresist increasing the volume of the photoresist.

10. The method of claim 1, wherein the dissolution-controlled regime is transitioned to the expansion-controlled regime at a gel point dose.

11. The method of claim 1, wherein the method of simulating the development process of photoresists comprises stochastically simulating the development process of photoresists.

12. The method of claim 1, further comprising correcting the optical proximity of the mask on a full chip.

13. The method of claim 1, further comprising placing and verifying of the mask sub-resolution assist feature on a full chip.

14. The method of claim 1, further comprising repairing the mask sub-resolution assist feature.

15. The method of claim 1, further comprising inspecting the mask on a full chip.

16. The method of claim 1, further comprising identifying, diagnosing, and/or repairing the mask hot-spot on a full chip.

17. The method of claim 1, further comprising optimizing an illumination source on a full chip.

18. A method of forming an integrated circuit, comprising:
simulating a negative-tone development process of a photoresist, comprising:
determining a reaction of a developer with a photoresist surface comprising:
applying a reaction rate constant at a power of a reaction order to a blocked polymer concentration to yield a resist dissolution rate of soluble resist comprising the dissolution-limited regime of development; and
determining a flux of the developer into exposed and partially soluble resist comprising:
applying a vector valued diffusion coefficient of the developer dependent upon the blocked polymer concentration to a gradient of developer concentration to an expansion rate of insoluble resist comprising the expansion-controlled regime of development; and
optimizing an illumination source and a mask on a full chip using a result from the simulation.

19. The method of claim 18, further comprising forming an integrated circuit using an optimized illumination source and mask on a full chip.

20. The method of claim 18, wherein the development process of photoresists comprises a negative-tone development process.

21. The method of claim 18, wherein the development process of photoresists comprises a positive-tone development process.

22. The method of claim 18, wherein the development process of photoresists comprises photoresists used for 248 nm (KrF), 193 nm (ArF) or 13.5 nm (EUV) lithography.

23. The method of claim 18, wherein applying the reaction rate constant ($k_R$) to the blocked polymer concentration (m)$k_R$(m)$^n$ at the power of the reaction order (n) to the dissolution rate of soluble resist ($R_D$) is equivalent to $k_R(m)^n$.

24. The method of claim 18, wherein determining a flux ($j_S(r,t)$) of the developer into exposed and partially soluble resist is determined by applying a vector-valued diffusion coefficient ($D_S$) of the developer dependent upon the blocked polymer concentration (m) is applied to a gradient of the developer concentration ($\nabla S$) at a point r and time t such that $$j_S(r,t)=-D_S(m)\nabla S(r,t).$$

25. The method of claim 18, wherein the dissolution-controlled regime applies when the photoresist surface is at least partially soluble to the developer.

26. The method of claim 18, wherein the expansion-controlled regime applies when the photoresist surface is substantially insoluble to the developer.

27. The method of claim 18, wherein the expansion-controlled regime applies when the photoresist surface is substantially insoluble to the developer such that the developer continues to absorb into the photoresist increasing the volume of the photoresist.

28. The method of claim 18, wherein the dissolution-controlled regime is transitioned to the expansion-controlled regime at a gel point dose.

29. The method of claim 18, wherein the method of simulating the development process of photoresists comprises stochastically simulating the development process of photoresists.

30. The method of claim 18, further comprising correcting the optical proximity of the mask on a full chip.

31. The method of claim 18, further comprising placing and verifying the mask sub-resolution assist feature on a full chip.

32. The method of claim 18, further comprising repairing the mask sub-resolution assist feature.

33. The method of claim 18, further comprising inspecting the mask on a full chip.

34. The method of claim 18, further comprising identifying, diagnosing, and/or repairing a mask hot-spot on a full chip.

* * * * *

UNITED STATES PATENT AND TRADEMARK OFFICE
CERTIFICATE OF CORRECTION

| | | |
|---|---|---|
| PATENT NO. | : 10,007,191 B2 | Page 1 of 1 |
| APPLICATION NO. | : 15/232302 | |
| DATED | : June 26, 2018 | |
| INVENTOR(S) | : Biafore et al. | |

It is certified that error appears in the above-identified patent and that said Letters Patent is hereby corrected as shown below:

In the Claims

Claim 1, Column 17, Line 21, please delete "a gradient of developer concentration to an expansion rate of insoluble resist" and substitute therefor --a gradient of developer concentration to yield an expansion rate of insoluble resist--.

Claim 5, Column 17, Line 38, please delete "at the power of the reaction order (n) to the dissolution rate of soluble resist (RD) is equivalent to" and substitute therefor --at the power of the reaction order (n) to yield the dissolution rate of soluble resist (RD) equivalent to--.

Claim 6, Column 17, Line 41, please delete "determining a flux" and substitute therefor --wherein a flux--.

Claim 6, Column 17, Line 45, please delete "is applied to a gradient" and substitute therefor --to a gradient--.

Claim 18, Column 18, Line 30, please delete "a gradient of developer concentration to an expansion rate of insoluble resist" and substitute therefor --a gradient of developer concentration to yield an expansion rate of insoluble resist--.

Claim 23, Column 18, Line 49, please delete "at the power of the reaction order (n) to the dissolution rate of soluble resist (RD) is equivalent to" and substitute therefor --at the power of the reaction order (n) to yield the dissolution rate of soluble resist (RD) equivalent to--.

Claim 24, Column 18, Line 52, please delete "wherein determining a flux" and substitute therefor --wherein a flux--.

Claim 24, Column 18, Line 56, please delete "is applied to a gradient" and substitute therefor --to a gradient--.

Signed and Sealed this
Seventeenth Day of September, 2019

Andrei Iancu
*Director of the United States Patent and Trademark Office*